(12) United States Patent
Clevenger et al.

(10) Patent No.: US 12,387,983 B2
(45) Date of Patent: Aug. 12, 2025

(54) FORMING SELF-ALIGNED VIAS AND AIR-GAPS IN SEMICONDUCTOR FABRICATION

(71) Applicant: Adeia Semiconductor Solutions LLC, San Jose, CA (US)

(72) Inventors: Lawrence A. Clevenger, Saratoga Springs, NY (US); Carl J. Radens, LaGrangeville, NY (US); John H. Zhang, Altamont, NY (US)

(73) Assignee: Adeia Semiconductor Solutions LLC, San Jose, CA (US)

( * ) Notice: Subject to any disclaimer, the term of this patent is extended or adjusted under 35 U.S.C. 154(b) by 395 days.

(21) Appl. No.: 17/833,366

(22) Filed: Jun. 6, 2022

(65) Prior Publication Data
US 2022/0406658 A1    Dec. 22, 2022

Related U.S. Application Data

(63) Continuation of application No. 17/181,399, filed on Feb. 22, 2021, now Pat. No. 11,380,583, which is a continuation of application No. 16/257,221, filed on Jan. 25, 2019, now Pat. No. 10,930,553, which is a continuation of application No. 15/815,173, filed on
(Continued)

(51) Int. Cl.
| | |
|---|---|
| *H01L 21/768* | (2006.01) |
| *H01L 21/311* | (2006.01) |
| *H01L 23/522* | (2006.01) |
| *H01L 23/528* | (2006.01) |

(Continued)

(52) U.S. Cl.
CPC .. *H01L 21/76897* (2013.01); *H01L 21/31111* (2013.01); *H01L 21/31144* (2013.01); *H01L 21/76808* (2013.01); *H01L 21/76816* (2013.01); *H01L 21/7682* (2013.01); *H01L 21/76837* (2013.01); *H01L 21/76877* (2013.01); *H01L 23/5226* (2013.01); *H01L 23/528* (2013.01); *H10D 84/0149* (2025.01); *H10D 84/038* (2025.01); *H10D 84/016* (2025.01)

(58) Field of Classification Search
CPC ......... H01L 21/76897; H01L 21/31111; H01L 21/31144; H01L 21/76816; H01L 21/7682; H01L 21/76877; H01L 21/823475; H01L 23/5226; H01L 23/528
See application file for complete search history.

(56) References Cited

U.S. PATENT DOCUMENTS

| | | | |
|---|---|---|---|
| 2018/0164698 A1* | 6/2018 | Yang | ............... G03F 7/0047 |
| 2021/0082800 A1* | 3/2021 | Schenker | .......... H01L 21/76801 |

* cited by examiner

*Primary Examiner* — Mohammad M Choudhry
(74) *Attorney, Agent, or Firm* — Haley Guiliano LLP

(57) ABSTRACT

A semiconductor device includes a first trench on a mandrel line through a top mask layer and stopping at a middle mask layer; and a second trench on a non-mandrel line through the top mask layer and stopping at the middle mask layer. A spacer material is removed from a structure resulting from etching the first trench and the second trench. The device includes a first via structure, formed using a removable material, in the first trench; a second via structure, formed using a removable material, in the second trench; an air-gap formed in a third trench created at a location of the spacer; a fourth trench formed by etching, to remove the first via structure and a first portion of a bottom mask layer under the first via structure; and a self-aligned line-end via on the mandrel line formed by filling the fourth trench with a conductive metal.

19 Claims, 16 Drawing Sheets

Related U.S. Application Data

Nov. 16, 2017, now Pat. No. 10,242,911, which is a continuation of application No. 15/472,745, filed on Mar. 29, 2017, now Pat. No. 9,911,652.

(51) Int. Cl.
*H10D 84/01* (2025.01)
*H10D 84/03* (2025.01)

FORMING SELF-ALIGNED VIAS AND AIR-GAPS IN SEMICONDUCTOR FABRICATION

CROSS-REFERENCE TO RELATED APPLICATION(S)

This patent application is a continuation of and claims priority to U.S. patent application Ser. No. 17/181,399, filed Feb. 22, 2021, which is a continuation of U.S. patent application Ser. No. 16/257,221, filed Jan. 25, 2019, now U.S. Pat. No. 10,930,553, issued Feb. 23, 2021, which is a continuation of U.S. patent application Ser. No. 15/815,173, filed Nov. 16, 2017, now U.S. Pat. No. 10,242,911, issued Mar. 26, 2019, which is a continuation of U.S. patent application Ser. No. 15/472,745, filed Mar. 29, 2017, now U.S. Pat. No. 9,911,652, issued Mar. 6, 2018, which are fully incorporated herein by reference.

TECHNICAL FIELD

The present invention relates generally to a method, system, and computer program product for reducing the resistance and/or capacitance of a current path in vertical fin semiconductor devices. More particularly, the present invention relates to a method, system, and computer program product for forming self-aligned vias and air-gaps in semi conductor fabrication.

BACKGROUND

An integrated circuit (IC) is an electronic circuit formed using a semiconductor material, such as Silicon, as a substrate and by adding impurities to form solid-state semiconductor electronic devices (device, devices), such as transistors, diodes, capacitors, and resistors. Any reference to a "device" herein refers to a solid-state semiconductor electronic device unless expressly distinguished where used. Commonly known as a "chip" or a "package," an integrated circuit is generally encased in hard plastic, forming a "package." The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer. A cut mask is a mask usable to cut or form a pattern in one or more layers of materials during a fabrication process.

A device generally uses several layers of different materials to implement the device properties and function. A layer of material can be conductive, semi-conductive, insulating, resistive, capacitive, or have any number of other properties. Different layers of materials have to be formed using different methods, given the nature of the material, the shape, size or placement of the material, other materials adjacent to the material, and many other considerations.

An IC may use many layers of silicon to implement a circuit. In other words, components forming the circuit may be placed on different layers of silicon in a chip. Interconnects connecting the components on one layer to components on different layers go through the silicon layer. Such interconnects are also known as through silicon vias (TSVs).

The software tools used for designing ICs produce, manipulate, or otherwise work with the circuit layout and circuit components on very small scales. Some of the components that such a tool may manipulate may only measure a few nanometers across when formed in Silicon. The designs produced and manipulated using these software tools are complex, often including hundreds of thousands of such components interconnected to form an intended electronic circuitry.

The illustrative embodiments recognize that the present methods and techniques for fabricating vias are stretched to their limits due to the increased complexity of designs, increased density of components, reduced dimensions of the components, and the like. The existing process for fabricating vias is largely unsuitable for fabricating and interconnecting inline vias, line-end vias, and air-gaps, that each align with the lines in a given IC.

A line is a semiconductor structure formed to carry current to or from a semiconductor device, or in between semiconductor devices. A mandrel line and a non-mandrel line are two different types of lines. An inline via is a via that is fabricated on (or aligned with) a mandrel or non-mandrel line. A line-end via is a via that is fabricated at the end of a mandrel or non-mandrel line.

An air-gap is a hollow space, generally encapsulating vacuum, that is created within a structure formed in semiconductor material. An air-gap is used for reducing capacitance between adjacent structures, such as adjacent vias and/or lines. An air-gap can be formed by filling a shaped recess and pinching the material at the top of the fill.

Inline vias and line-end vias should align with lines, and air-gaps formed between such vias and/or lines should align with the vias and/or lines. Such self-aligned vias and air-gaps are presently difficult to fabricate and interconnect. Therefore, a method for fabricating forming self-aligned vias and air-gaps in semiconductor fabrication would be desirable.

SUMMARY

The illustrative embodiments provide a method, system, and computer program product. An embodiment includes a method that etches a first trench at a first location on a mandrel line in a set of mandrel lines, through a top mask layer and stopping at a middle mask layer. The embodiment etches a second trench at a second location on a non-mandrel line in a set of non-mandrel lines, through the top mask layer and stopping at the middle mask layer. The embodiment removes a spacer material from a structure resulting from etching the first trench and the second trench. The embodiment forms, using a removable material, a first via structure in the first trench and second via structure in the second trench. The embodiment forms an air-gap in a third trench created at a location of the spacer. The embodiment etches, to remove the first via structure and a first portion of a bottom mask layer under the first via structure, to form a fourth trench. The embodiment fills the fourth trench with a conductive metal to form a self-aligned line-end via on the mandrel line. Thus, the embodiment enables fabricating self-aligned vias on mandrel lines.

Another embodiment further etches, to remove the second via structure and a second portion of the bottom mask layer under the second via structure, to form a fifth trench. The embodiment fills the fifth trench with the conductive metal to form a self-aligned inline via on the non-mandrel line. Thus, the embodiment enables fabricating self-aligned vias on non-mandrel lines.

In another embodiment, the air-gap is aligned with the first via structure and the second via structure. Thus, the embodiment enables fabricating self-aligned air-gaps.

Another embodiment further fills the third trench with a low resistance material such that a hollow space is encapsulated within the low resistance material, the hollow space forming the air-gap. Thus, the embodiment enables fabricating an air-gap.

Another embodiment further stops, as a part of etching the third trench, the third trench at the bottom mask layer. Thus, the embodiment enables fabricating self-aligned vias and self-aligned air-gaps of one size.

Another embodiment further stops, as a part of etching the third trench, the third trench at the middle mask layer. Thus, the embodiment enables fabricating self-aligned vias and self-aligned air-gaps of another size.

In another embodiment, the second via structure and a third via structure are both inline vias, wherein the second via structure is aligned with the third via structure, and wherein the second via structure and the third via structure are both aligned with the non-mandrel line. Thus, the embodiment enables fabricating self-aligned vias on mandrel lines and non-mandrel lines, and self-aligned air-gaps.

In another embodiment, the first via structure and a third via structure are both line-end vias, wherein the first via structure is aligned with the third via structure, and wherein the first via structure and the third via structure are both aligned with the mandrel line. Thus, the embodiment enables fabricating self-aligned vias on mandrel lines and non-mandrel lines, and self-aligned air-gaps.

Another embodiment further separates two adjacent vias in the mandrel line with an intervening dielectric structure extending from the middle mask layer to the top mask layer. Thus, the embodiment enables separating self-aligned vias.

Another embodiment further fills the first trench and the second trench with the removable material up to the top mask layer. Thus, the embodiment enables another method of fabricating self-aligned vias.

Another embodiment further forms, in the structure, above the bottom mask layer, the first layer of a first material topped by the middle mask layer. The embodiment forms, above the middle mask layer, the second layer of a second material topped by the top mask layer. Thus, the embodiment enables another method of fabricating self-aligned vias.

Another embodiment further removes the top mask layer from above the spacer. The embodiment etches to create the third trench at the location of the spacer. Thus, the embodiment enables another method of fabricating self-aligned vias.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
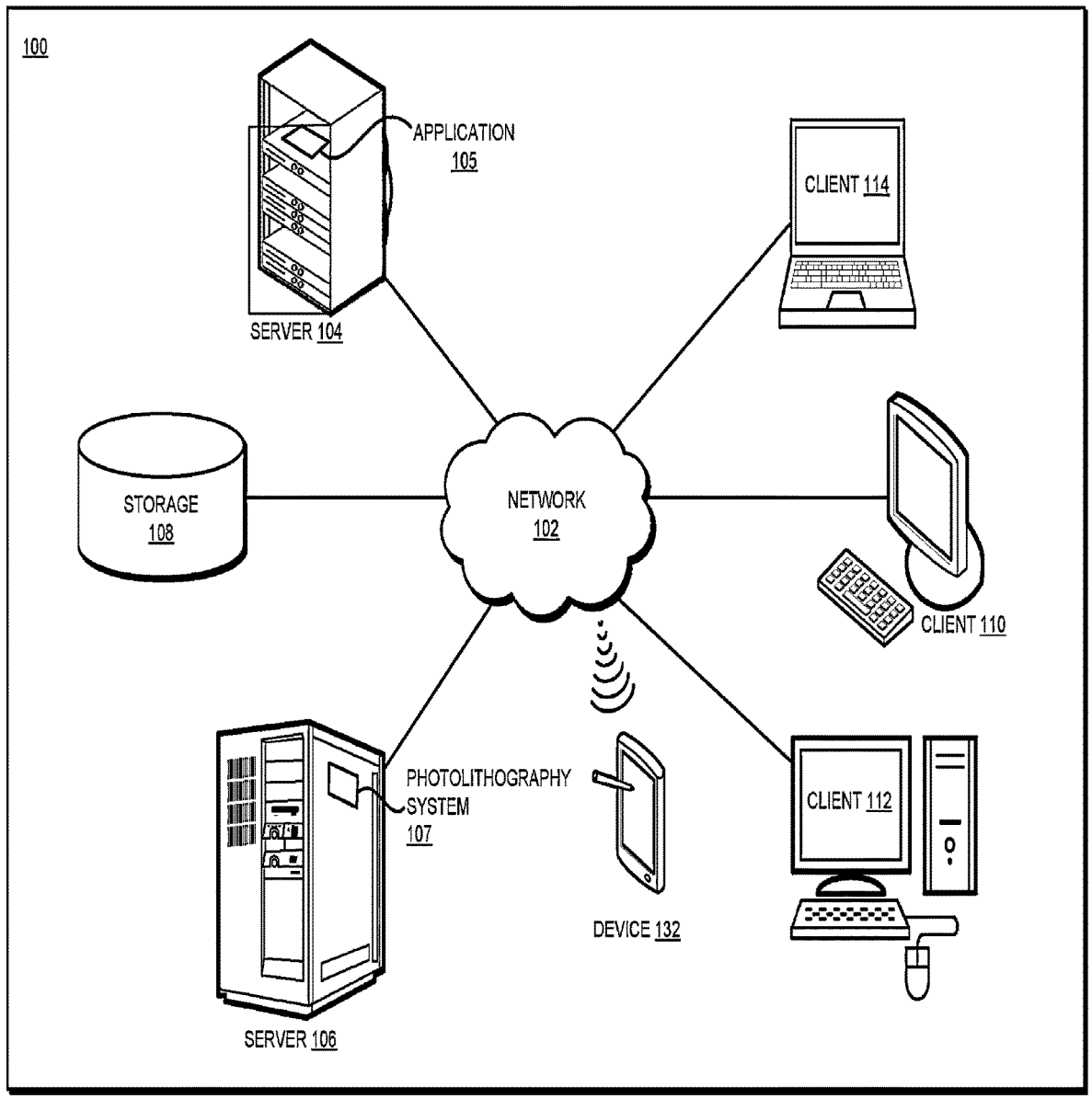
FIG. 1 depicts a block diagram of a network of data processing systems in which illustrative embodiments may be implemented.

The illustrative embodiments used to describe the invention generally address and solve the above-described problems and other problems related to forming self-aligned vias and air-gaps in semiconductor fabrication.

An embodiment can be implemented as a software application. The application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate a set of inline vias, a set of line-end vias, and a set of air-gaps, all self-aligned, as described herein.

For the clarity of the description, and without implying any limitation thereto, the illustrative embodiments are described using certain types and numerosity of lines, certain types and numerosity of vias, certain numbers of layers in which to form the vias, certain numbers and positions of air-gaps. An embodiment can be implemented with a different types and numbers of lines and/or vias, with or without air-gaps, within the scope of the illustrative embodiments. An embodiment can be implemented for fabricating other types of interconnecting structures that have to be aligned with certain other structures within the scope of the illustrative embodiments.

Furthermore, a simplified diagram of the example layout with example lines and vias is used in the figures and the illustrative embodiments. In an actual fabrication of a circuit, additional structures that are not shown or described herein, or structures different from those shown and described herein, may be present without departing the scope of the illustrative embodiments. Similarly, within the scope of the illustrative embodiments, a shown or described example structure may be fabricated differently to yield a similar operation or result as described herein.

Differently shaded portions in the two-dimensional drawing of the fabricated example structures are intended to represent different structures, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a component or structure according to the illustrative embodiments.

Furthermore, the illustrative embodiments are described with respect to certain orientations and directions only as an example. The steps described by the various illustrative embodiments can be adapted for fabricating other planar and non-planar devices in a similar manner, and such adaptations are contemplated within the scope of the illustrative embodiments. The specific placements of layers, structures, or features are also used only as non-limiting examples to describe the various operations of the illustrative embodiments. Those of ordinary skill in the art will be able to use an embodiment to similarly fabricate aligned structures for other purposes in a similar manner, and such usage is also contemplated within the scope of the illustrative embodiments.

An embodiment when implemented in an application causes a fabrication process to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in forming self-aligned vias and air-gaps in semiconductor fabrication. A manner of fabricating line-end vias or other similarly purposed interconnects, is unavailable in the presently available methods. Thus, a substantial advancement of such devices or data processing systems by executing a method of an embodiment is in a new ability to fabricate self-aligned inline vias and self-aligned line-end vias with self-aligned air-gaps, or other similarly purposed interconnects.

The illustrative embodiments are described with respect to certain types of devices, electrical properties, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
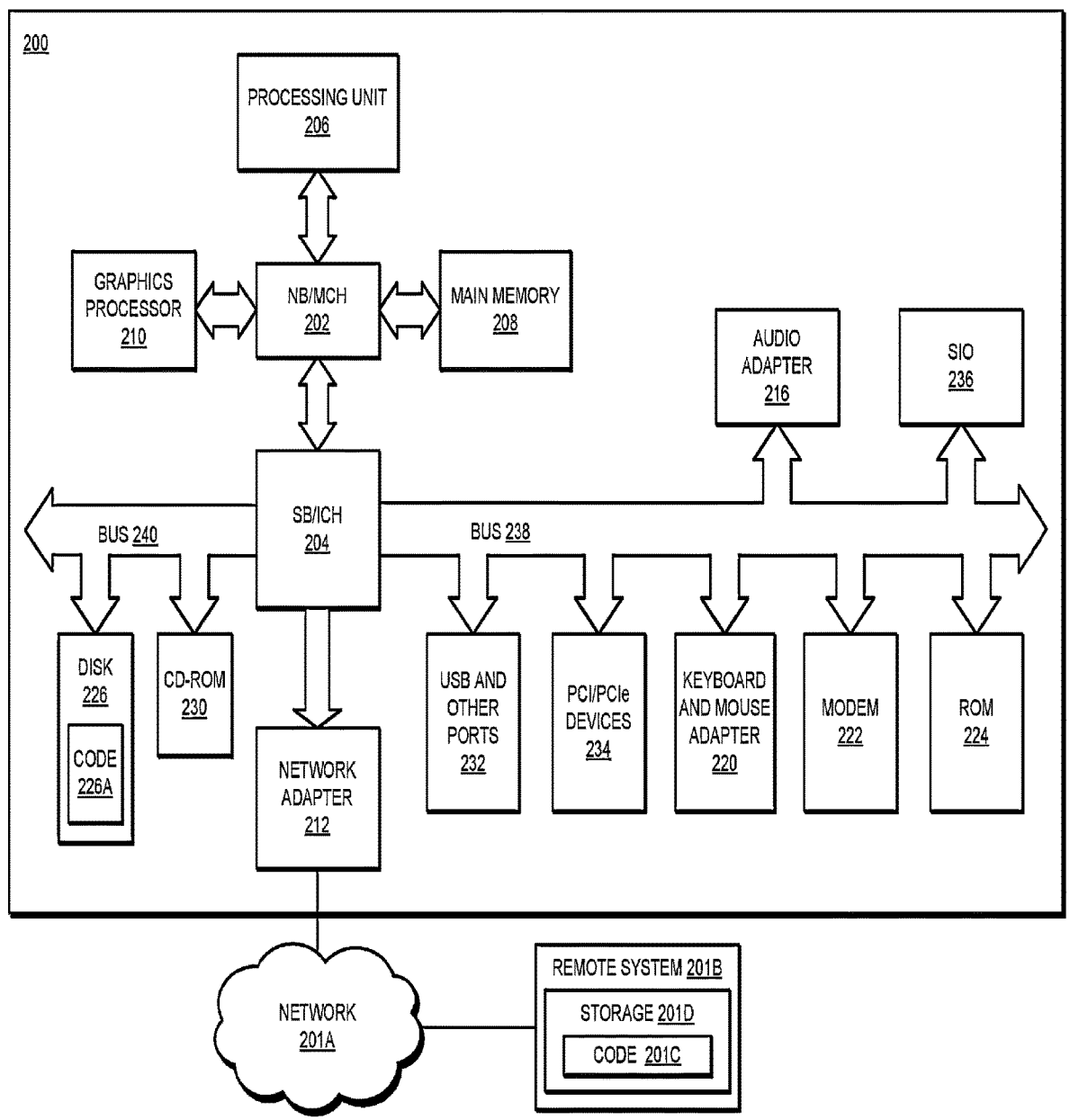
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a data processing device or a portable device usable for computing or communications purposes described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device or circuit. Application 105 provides instructions to system 107 for fabricating self-aligned inline vias and self-aligned line-end vias with self-aligned air-gaps, or other similarly purposed interconnects, in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other data processing devices, such as mobile device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different computer-components or data processing devices attached to the fabric or architecture.

A communications unit may include one or more communications-capable devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Four views are shown in each of FIGS. 3-15. each view is of a step of a process depicted in each of those figures according to the illustrative embodiments. Unless otherwise noted for a figure, each of FIGS. 3-15 depicts a top view (labelled "TOP") of the structure in the top left quadrant of the figure, a sectional view at section AA (labelled "AA") in the bottom left quadrant of the figure, a sectional view at section BB (labelled "BB") in the bottom right quadrant of the figure, and a sectional view at section CC (labelled "CC") in the top right quadrant of the figure.

Figure 3:
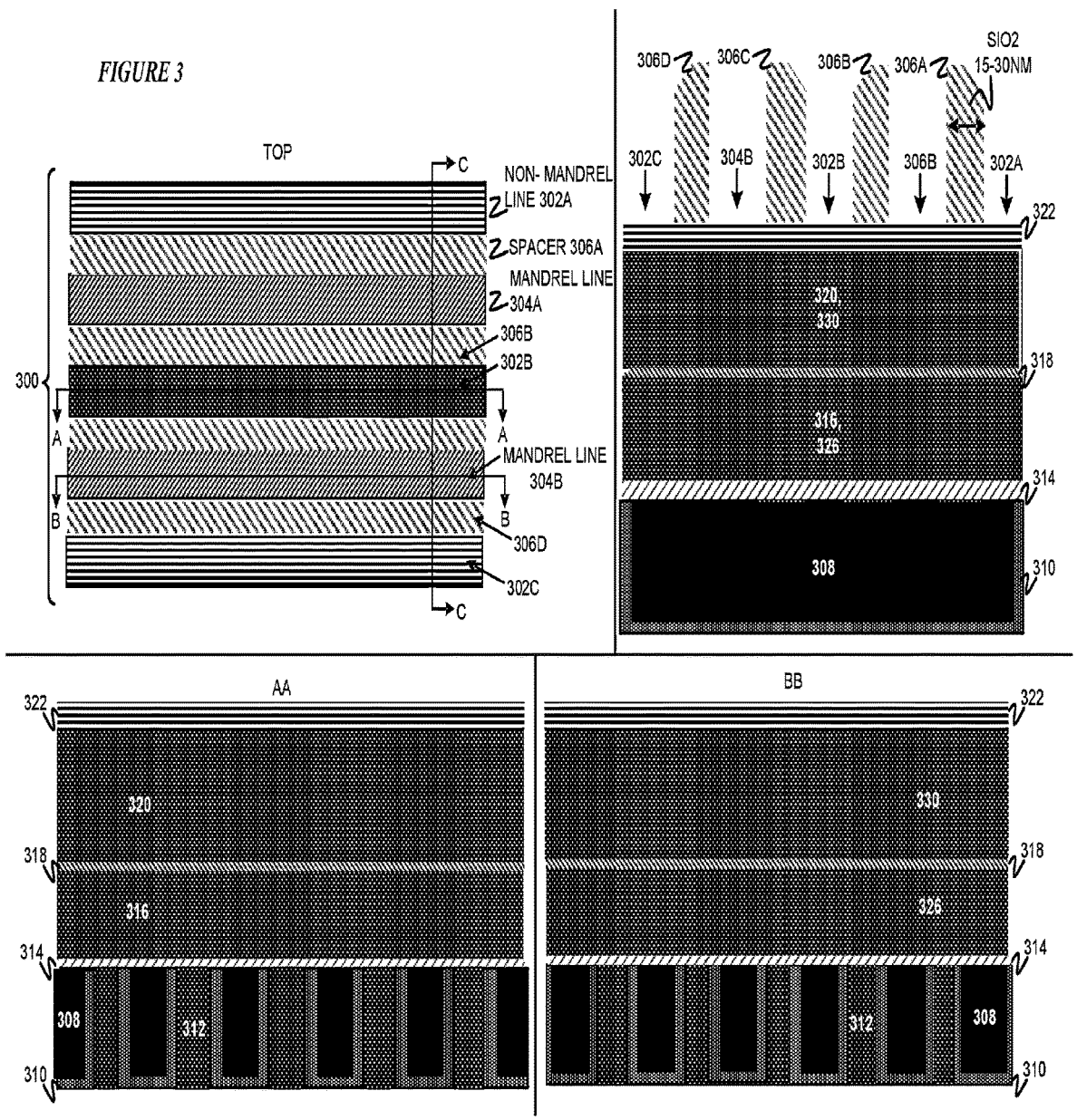
FIG. 3 depicts a block diagram of a portion of an example process for fabricating example self-aligned inline and line-end vias with air-gaps in accordance with an illustrative embodiment.

With reference to FIG. 3, this figure depicts a block diagram of a portion of an example process for fabricating example self-aligned inline and line-end vias with air-gaps in accordance with an illustrative embodiment. Application 105 in FIG. 1 interacts with fabrication system 107 to produce or manipulate structure 300 as described herein.

Structure 300 is formed on a suitable substrate, in which one or more layers have been formed. According to the TOP view, structure 300 comprises a non-limiting number of non-mandrel lines 302A, 302B, and 302C. Similarly, structure 300 comprises a non-limiting number of mandrel lines 304A and 304B. Structure 300 also comprises a non-limiting number of spacer areas 306A, 306B, 306C, and 306D. The non-mandrel lines, the mandrel lines, and the spacer areas are intermixed in a non-limiting example manner, as shown.

Sectioning line AA runs through non-mandrel line 302B. The AA view is an elevation view of structure 300 when section 300 is cut at sectioning line AA and a viewer is positioned opposite AA in the direction of the arrows marked on sectioning line AA to observe that elevation.

Sectioning line BB runs through mandrel line 304B. The BB view is an elevation view of structure 300 when section 300 is cut at sectioning line BB and a viewer is positioned opposite BB in the direction of the arrows marked on sectioning line BB to observe that elevation.

Sectioning line CC runs across all mandrel lines, non-mandrel lines, and all spacers. The CC view is a side-elevation view of structure 300 when section 300 is cut at sectioning line CC and a viewer is positioned opposite CC in the direction of the arrows marked on sectioning line C to observe that side-elevation.

The AA, BB, and CC views show an example composition of structure 300. For example, according to the AA view, inside or over a suitable substrate, metal structures 308 are formed, with example liner 310 of a suitable material. Material 312 is a material suitable for constructing vias and is disposed in the shown example manner relative to structures 308-310.

Layer 314 is a hard mask (HM) layer of a suitable material, such as, but not limited to, a suitable metal. Layer 316 is formed of a material suitable for constructing inline vias. Layer 316 is of a depth sufficient to form a portion of a desired height of an inline via, e.g., 20-50 nanometers (nm).

Layer 318 is a trench stop layer of a suitable material that is usable for stopping a trenching or etching operation that forms a trench or recess in the material above layer 318. In one example, layer 318 is approximately 3 nm.

Layer 320 is formed of a material suitable for constructing inline vias. Layer 320 is of a depth sufficient to form another portion of a desired height of an inline via, e.g., 50-80 nanometers (nm). The materials of structures 312, 316, and 320 may be the same or different from one another within the scope of the illustrative embodiments. Layer 322 is a hard mask layer of a suitable material, such as, but not limited to, Tantalum Nitride (TaN). Thus, according to the AA view, layers 308, 310, 312, 314, 316, 318, 320, and 322 exist at non-mandrel line, e.g., at non-mandrel line 302B.

Further according to the BB view, layers 308, 310, and 314 exist at a mandrel line, such as at mandrel line 304B, as well. As different from view AA, view BB shows that layer 326 is created at the location of a mandrel line. Layer 326 is formed of a material suitable for constructing line-end vias. Layer 326 is of a depth sufficient to form a portion of a desired height of a line-end via, e.g., 20-50 nanometers (nm). Layer 318 above layer 326 is the same as in the location of the non-mandrel line shown in the AA view. Layer 330 is formed of a material suitable for constructing line-end vias. Layer 330 is of a depth sufficient to form another portion of a desired height of a line-end via, e.g., 50-80 nanometers (nm).

The materials of structures 312, 326, and 330 may be the same or different from one another within the scope of the illustrative embodiments. Furthermore, the materials of structures 316, 320, 326, and 330 may be the same or different from one another within the scope of the illustrative embodiments. Additionally, the depth of structure 316 may be the same or different as the depth of structure 326, and the depth of structure 320 may be the same or different as the depth of structure 330.

In the depicted example, the material for layers 312, 316, 320, 326, and 330 are the same, and the demarcation between the mandrel lines and the non-mandrel lines are not shown in view CC. structures 308 and 310 are the same as in views AA and BB. Structure 312 is not visible in view CC. Layers 314, 318, and 322 are the same as in views AA and BB. Structures 316 and 326 are not perceptibly distinct from one another in the depicted example owing to the same material in those structures in the non-limiting example. Structures 320 and 330 are not perceptibly distinct from one another in the depicted example owing to the same material in those structures in the non-limiting example.

Spacers 306A-D are visible above layer 322 in view CC. Non-mandrel lines 302A-C are positioned as indicated by arrows in the spaces between spacers 306A-D, as shown. Mandrel lines 304A-B are positioned as indicated by arrows in the spaces between spacers 306A-D, as shown.

Figure 4:
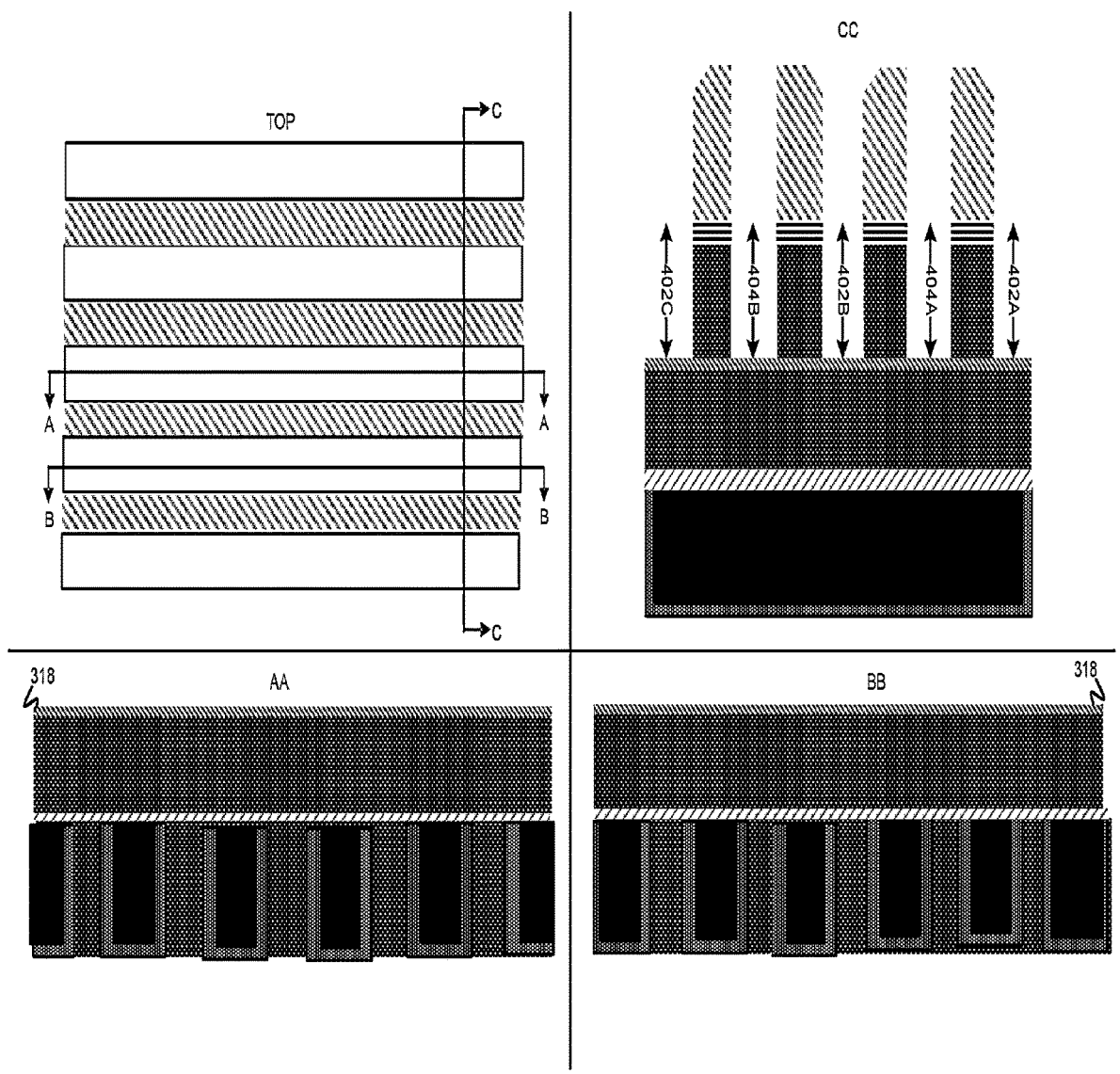
FIG. 4 depicts a block diagram of another portion of an example process for fabricating example self-aligned inline and line-end vias with air-gaps in accordance with an illustrative embodiment.

With reference to FIG. 4, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

An etching operation, such as using a reactive ion etching (REI) process, is performed on structure 300 at non-mandrel lines 302A-C and mandrel lines 304A-B locations. TOP view of this figure shows that an etching operation has been applied at those locations. AA and BB views show that the etching operation has been applied up to trench stop layer 318. View CC shows trench 402A, which has been formed at the location of non-mandrel line 302A, by etching through HM 322 and removing material 320 down to layer 318. Trenches 402B and 402C are formed in a similar manner. View CC shows trench 404A, which has been formed at the location of mandrel line 304A, by etching through HM 322 and removing material 330 down to layer 318. Trench 404B is formed in a similar manner.

Figure 5:
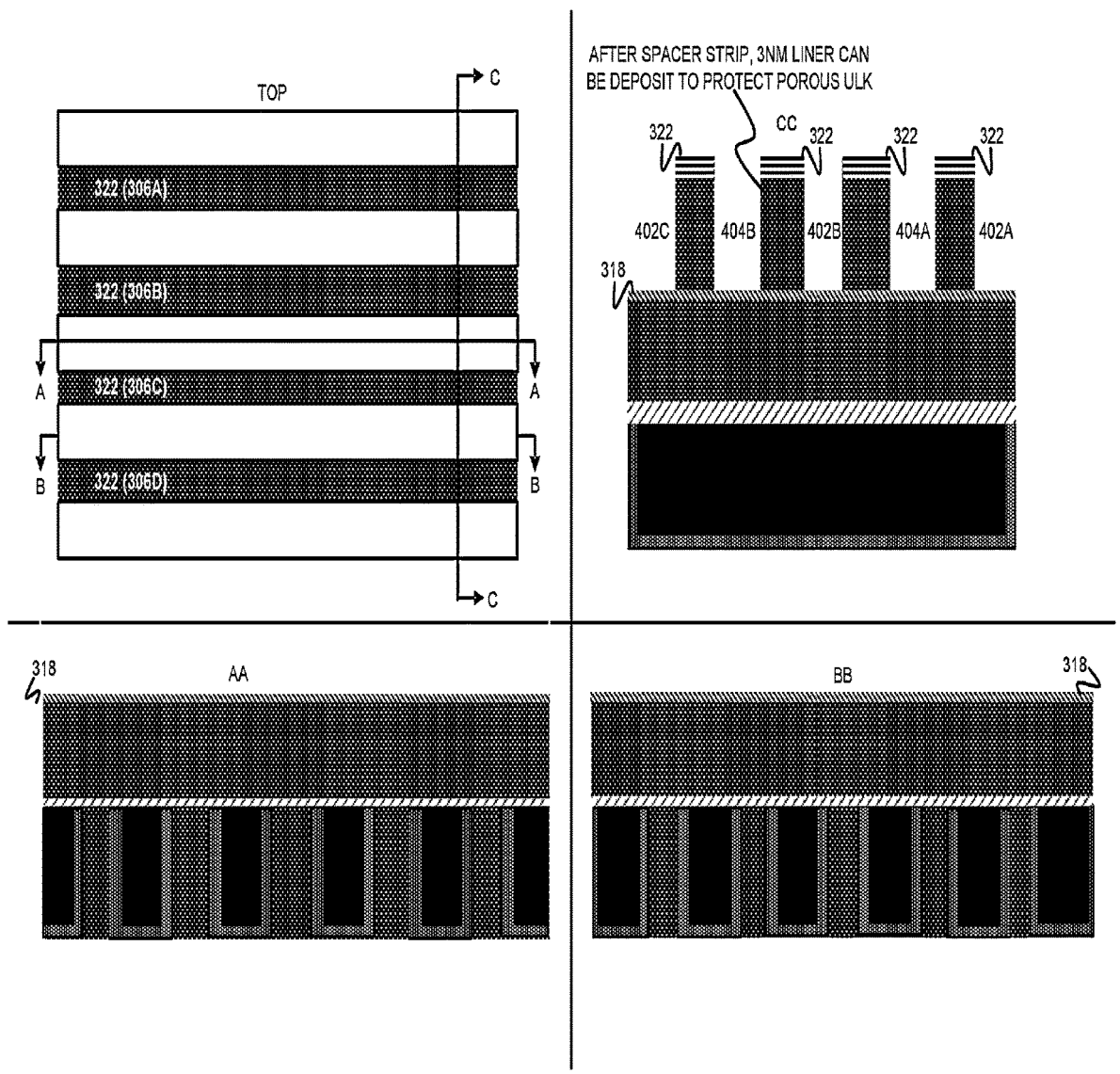
FIG. 5 depicts a block diagram of another portion of an example process for fabricating example self-aligned inline and line-end vias with air-gaps in accordance with an illustrative embodiment.

With reference to FIG. 5, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

Views AA and BB do not show any changes at the mandrel and non-mandrel line positions. TOP view and view CC show that the spacer material has been removed to expose HM 322 in the spacer locations 306A-D.

View CC also shows that, as an optional step, a liner of a suitable material and thickness can be deposited over HM 322 or as a substitute for HM 322 (if HM 322 is also removed from the spacer locations by the spacer removal process). Such a deposited liner may be useful to protect the ultra-low resistance (ULK) material left standing from the trenching operation of FIG. 4.

Figure 6:
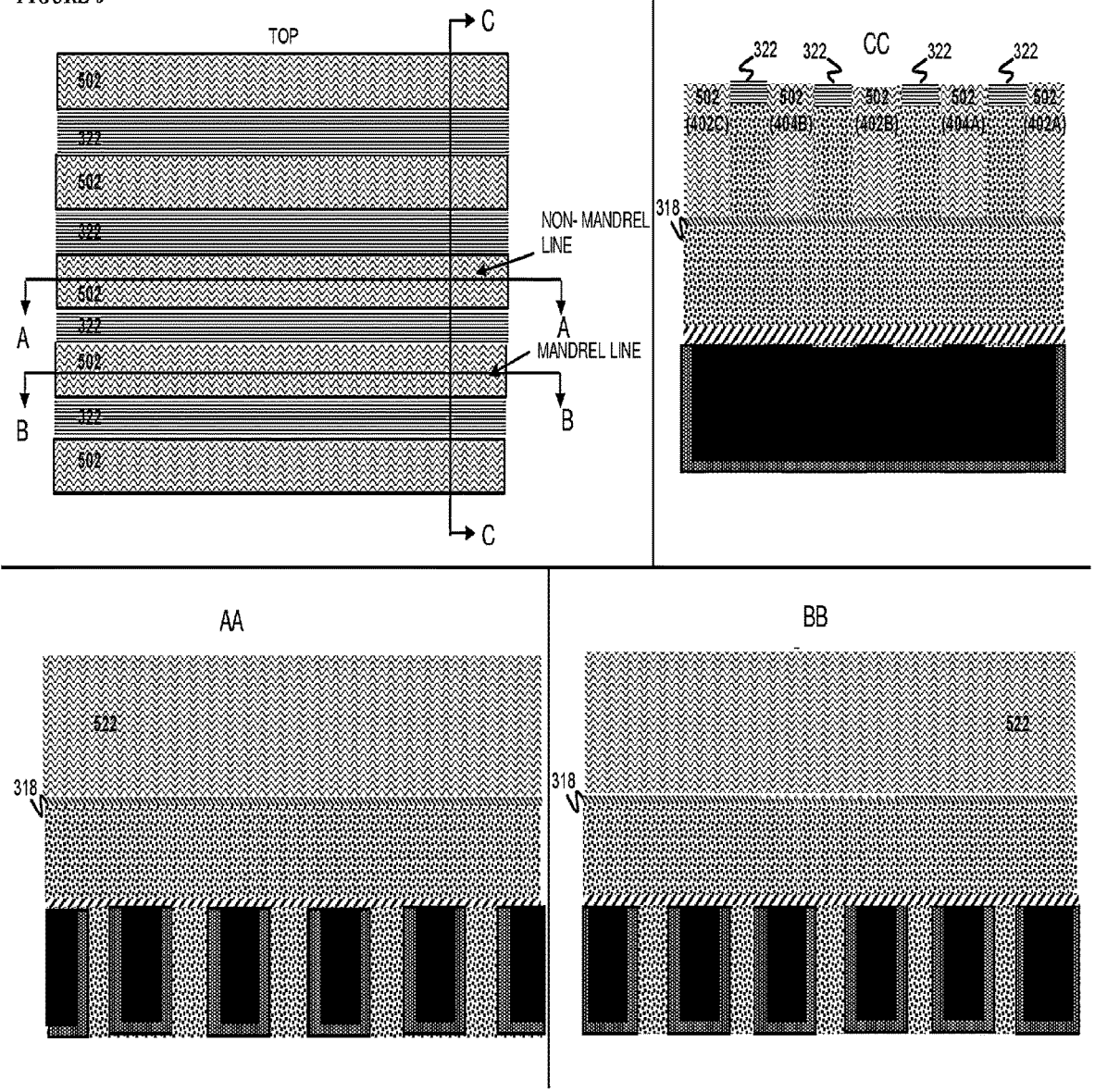
FIG. 6 depicts a block diagram of another portion of an example process for fabricating example self-aligned inline and line-end vias with air-gaps in accordance with an illustrative embodiment.

With reference to FIG. 6, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

Remaining trenches 402A-C and 404A-B, as depicted in FIG. 5, are filled with sacrificial or removable material 502. Some non-limiting examples of material 502 include, Optical Dispersive Layer (ODL) materials, and Chemical-Mechanical Planarization (CMP) material. The TOP and CC views show that the filling of material 502 stops at the level of HM 322. Views AA and BB show material 502 filled above HM 318 up to the top of HM 322 (not visible in views AA and BB as material 502 obstructs HM 322 in those views).

Figure 7:
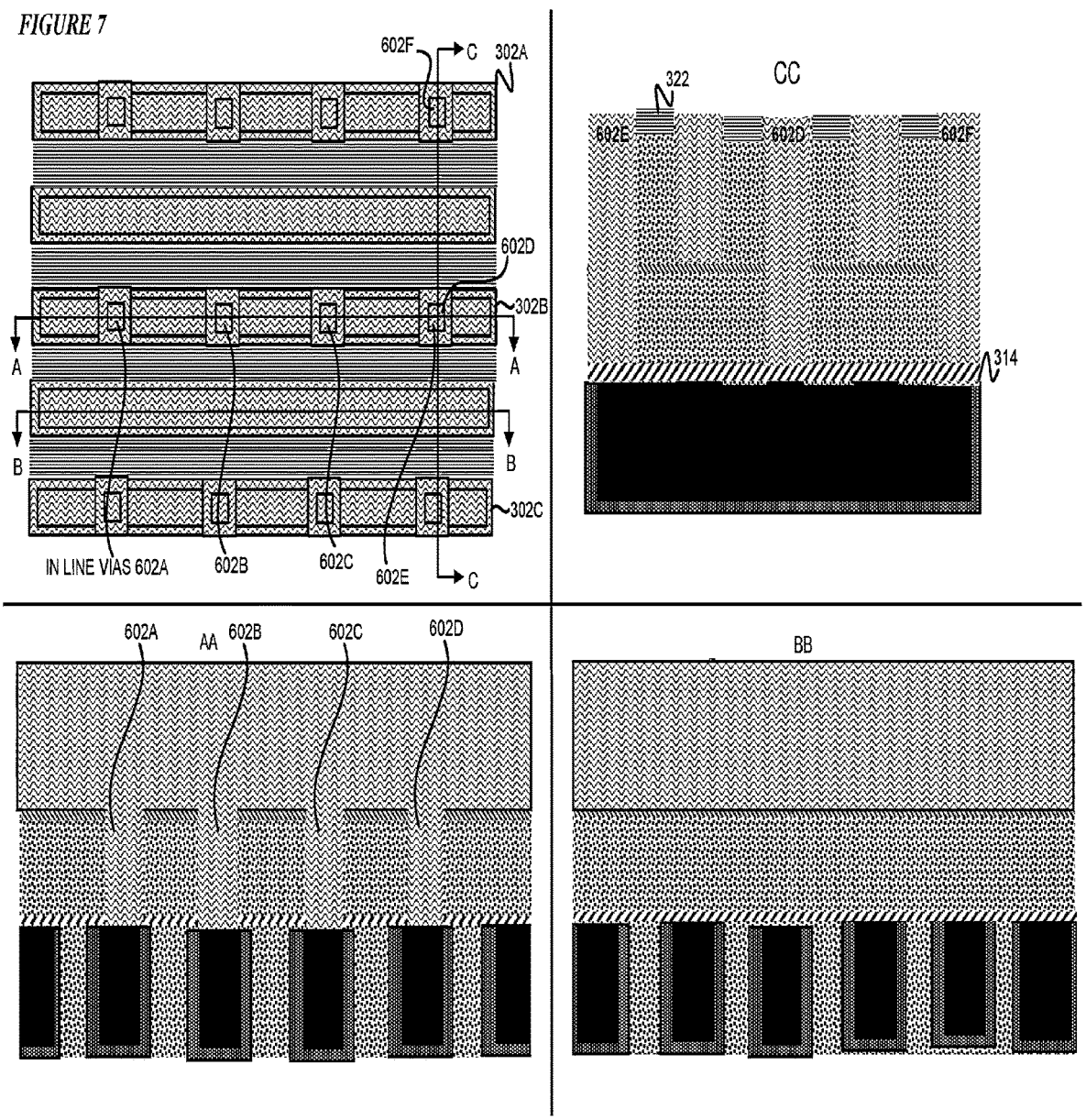
FIG. 7 depicts a block diagram of another portion of an example process for fabricating example self-aligned inline and line-end vias with air-gaps in accordance with an illustrative embodiment.

With reference to FIG. 7, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

Self-aligned inline vias are formed in the non-mandrel lines. For example, TOP view and view AA show that inline vias 602A, 602B, 602C, and 602D are formed using cut masks, and are aligned with each other and with non-mandrel line 302B. Similarly, as TOP view shows, inline via 602E is a self-aligned with other inline vias in non-mandrel line 302C, and inline via 602F is a self-aligned with other inline vias in non-mandrel line 302A. The inline vias formed in this manner stop at HM 322 on the top and HM 314 at the bottom, as shown in view CC. view BB being a cut section at a mandrel line has no vias because no vias have been formed in any mandrel line.

Figure 8:
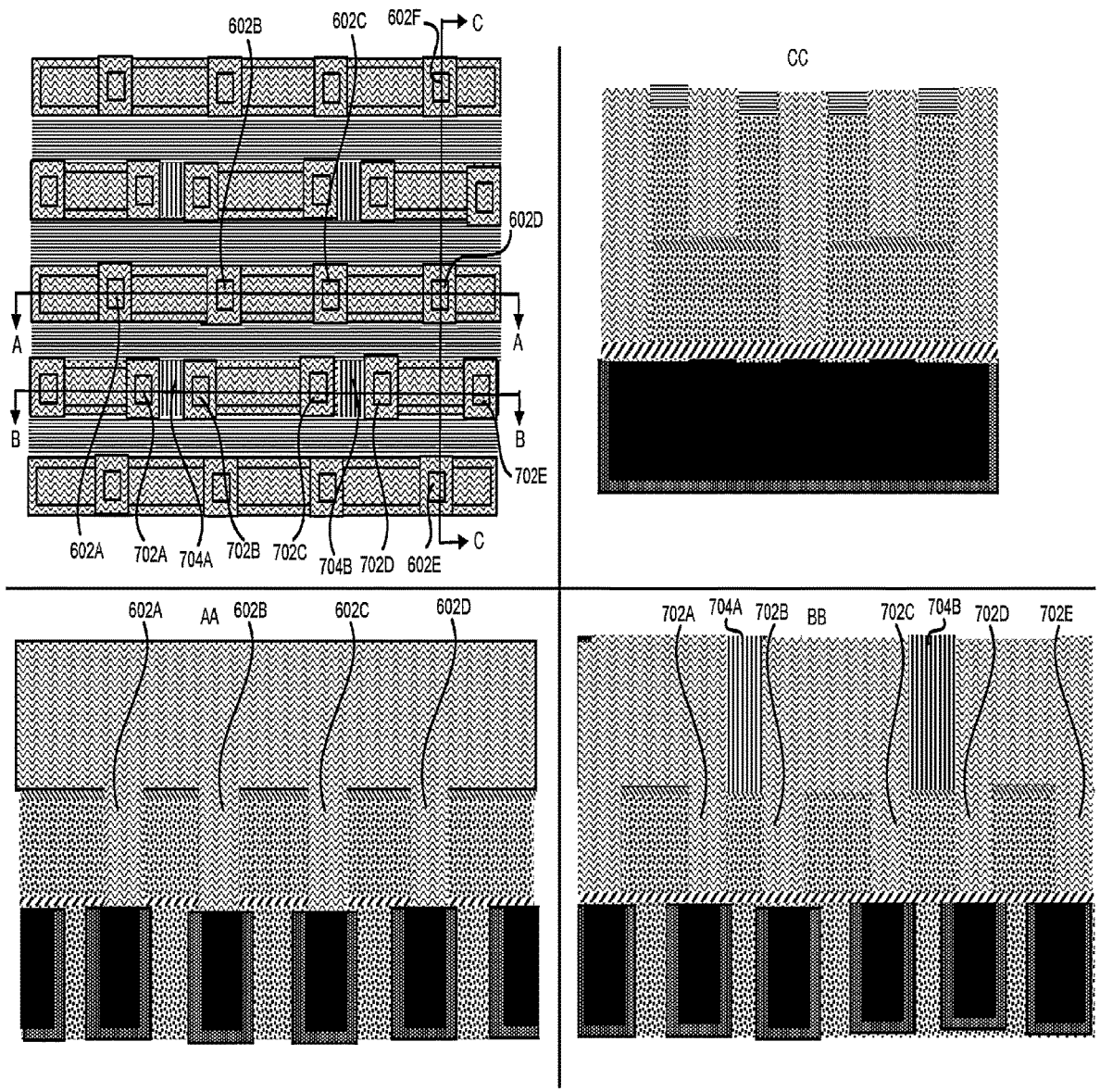
FIG. 8 depicts a block diagram of another portion of an example process for fabricating example self-aligned inline and line-end vias with air-gaps in accordance with an illustrative embodiment.

With reference to FIG. 8, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

Self-aligned line-end vias are formed in the mandrel lines. For example, TOP view and view BB show that line-end vias 702A, 702B, 702C, 702D, and 702E are formed using cut masks, and are aligned with each other and with mandrel line 304B. Depending on their location relative to one another, some line-end vias are separated from each other by a suitable dielectric material. For example, line-end vias 702A and 702B are separated by dielectric 704A; and line-end vias 702C and 702D are separated by dielectric 704B. The line-end vias and any separating dielectric structures formed in this manner stop at HM 322 on the top and HM 314 at the bottom, as shown in view CC. View AA cuts through only non-mandrel line 302B and therefore only shows inline vias 602A-D. view CC being a cut section at the location shown, does not cut through any line-end vias, and therefore does not show any line-end vias formed in any mandrel line.

Figure 9:
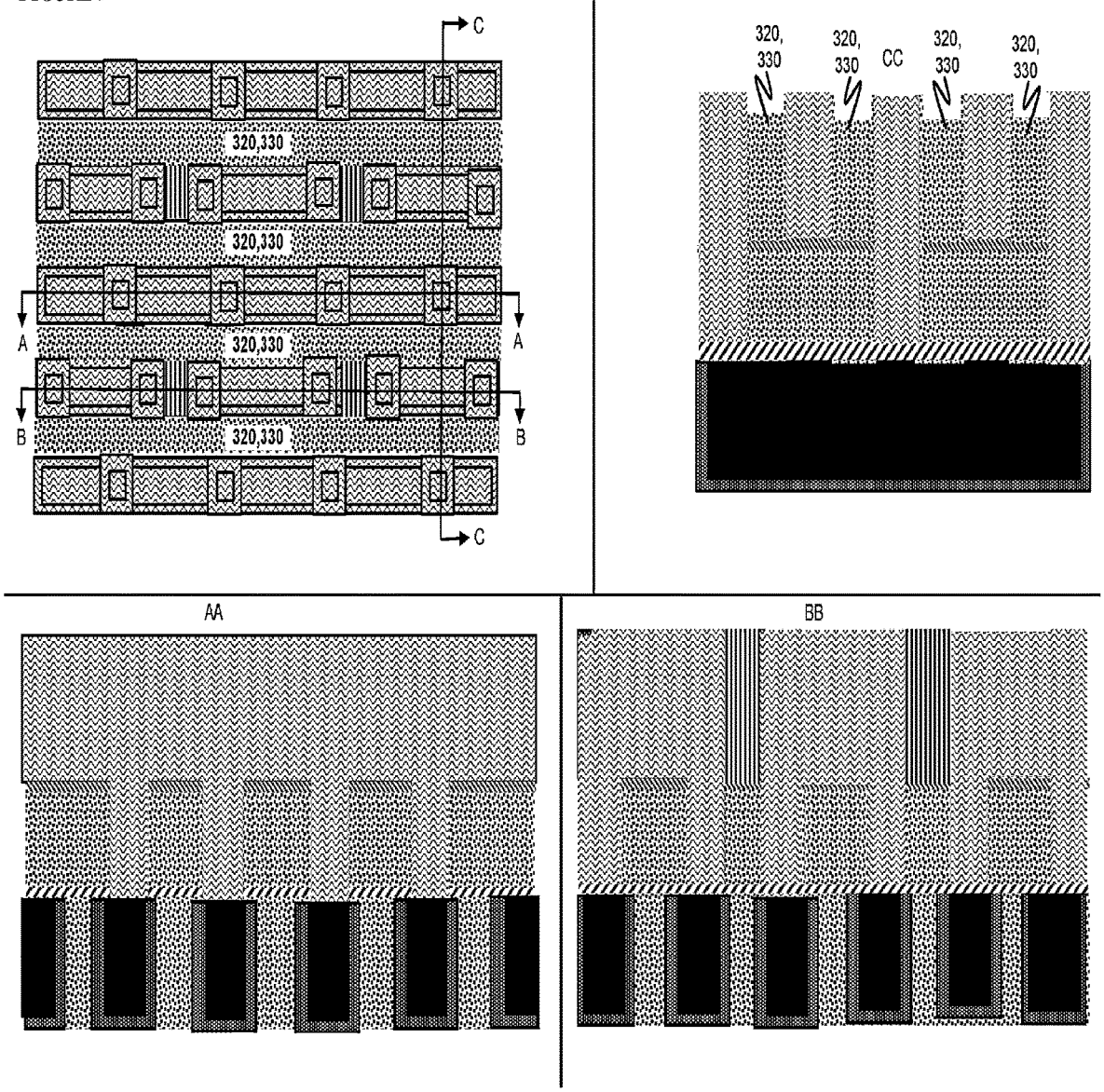
FIG. 9 depicts a block diagram of another portion of an example process for fabricating example self-aligned inline and line-end vias with air-gaps in accordance with an illustrative embodiment.

With reference to FIG. 9, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

The remaining HM 322 after the spacers were removed in FIG. 5, are removed. The removal of BM 322 reveals or exposes material 320 or 330 below, as shown in the TOP view and view CC. views AA and BB do not show the effect of this removal due to their relative cut locations with respect to the spacer locations.

Figure 10:
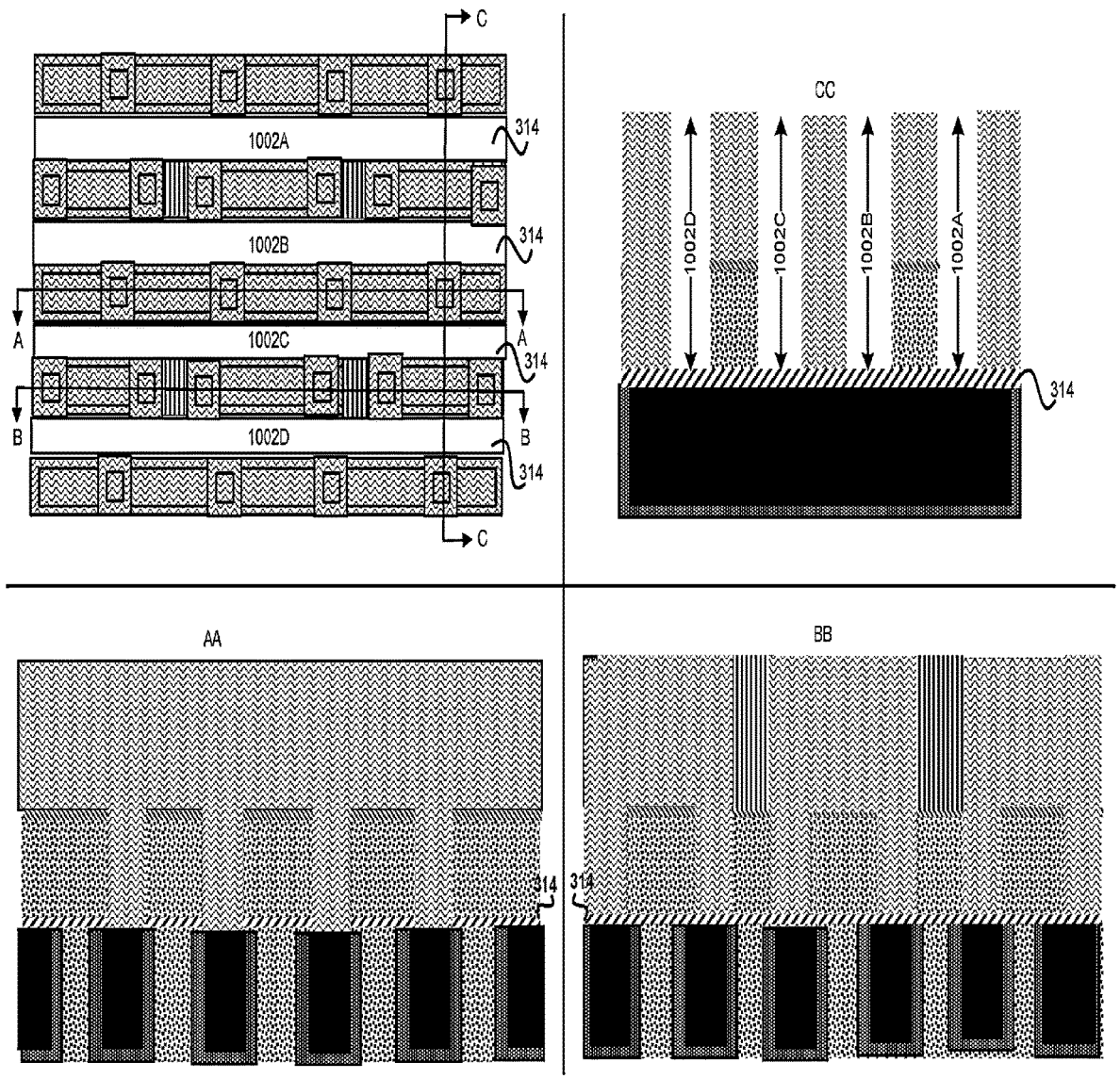
FIG. 10 depicts a block diagram of another portion of an example process for fabricating example self-aligned inline and line-end vias with air-gaps in accordance with an illustrative embodiment.

With reference to FIG. 10, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

All material located in the spacer locations 306A-D is removed, e.g., by using RIE. In one embodiment, the removal is performed up to bottom HM layer 314. The removal creates trenches 1002A, 1002B, 1002C, and 1002D in spacer locations 306A, 306B, 306C, and 306D, respectively, as shown in TOP view and view CC. views AA and BB do not show the effect of this removal due to their relative cut locations with respect to the spacer locations.

Figure 11:
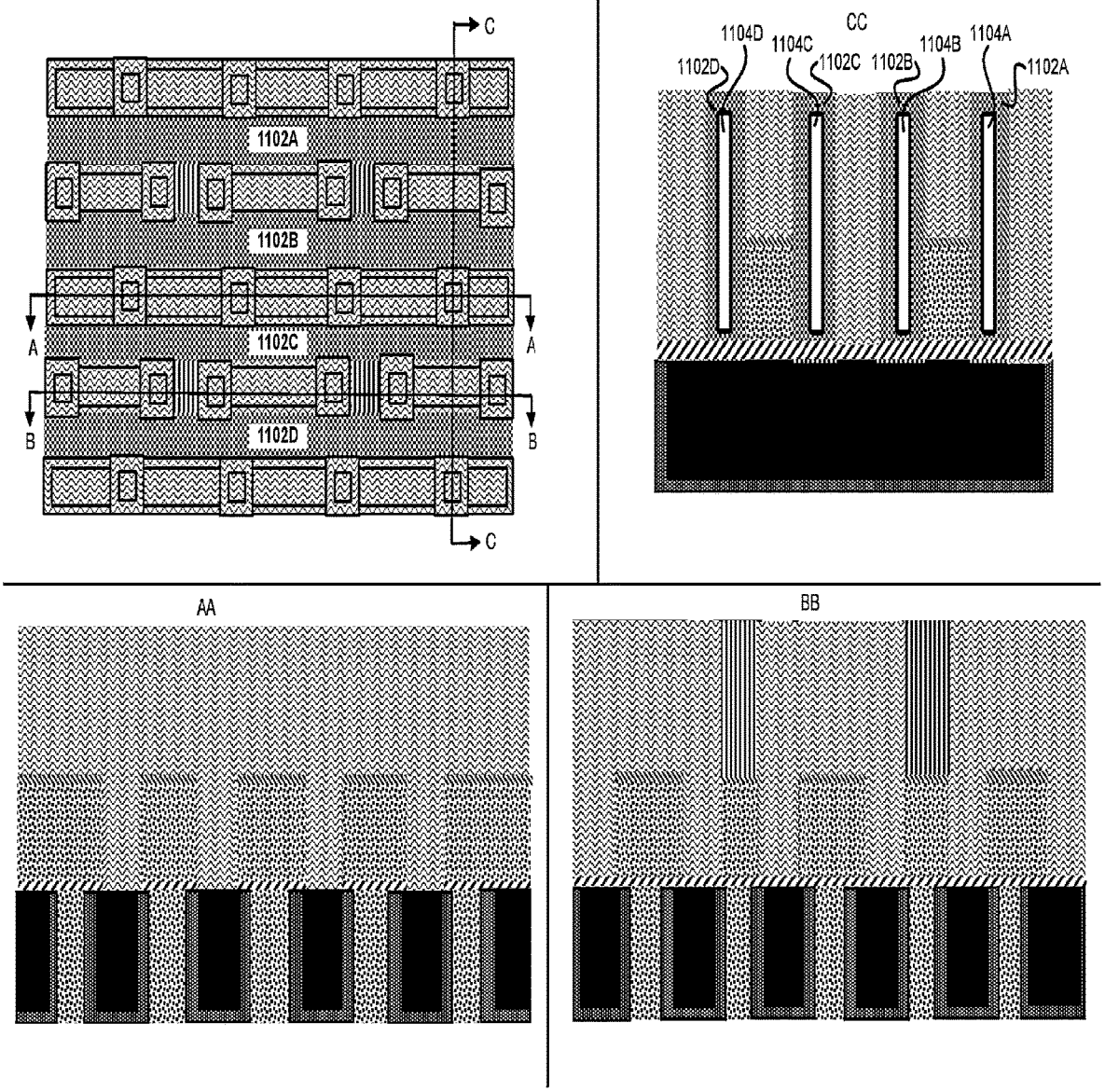
FIG. 11 depicts a block diagram of another portion of an example process for fabricating example self-aligned inline and line-end vias with air-gaps in accordance with an illustrative embodiment.

With reference to FIG. 11, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

A low resistance (low-K) material is filled in trenches 1002A-D. Low-K filling 1102A fills trench 1002A, filling 1102B fills trench 1002B, filling 1102C fills trench 1002D, and filling 1102D fills trench 1002D, as depicted in TOP view and view CC. Furthermore, low-K fillings 1102A-D are filled in trenches 1002A-D in such a way that air-gaps 1104A, 1104B, 1104C, and 1104D are formed in fillings 1102A-D, respectively, as depicted in TOP view and view CC. For example, low-K material such as SiOCN, SiBCN, SiCNH, or SiC, is filled in a trench and pinched off at the top to form an air-gap between mandrel line structures and a non-mandrel line structures. views AA and BB do not show the effect of this removal due to their relative cut locations with respect to the spacer locations.

With reference to FIG. 11, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

All material located in the spacer locations 306A-D is removed, e.g., by using RIE. In one embodiment, the removal is performed up to bottom HM layer 314. The removal creates trenches 1002A, 1002B, 1002C, and 1002D in spacer locations 306A, 306B, 306C, and 306D, respectively, as shown in TOP view and view CC. views AA and BB do not show the effect of this removal due to their relative cut locations with respect to the spacer locations.

Figure 12:
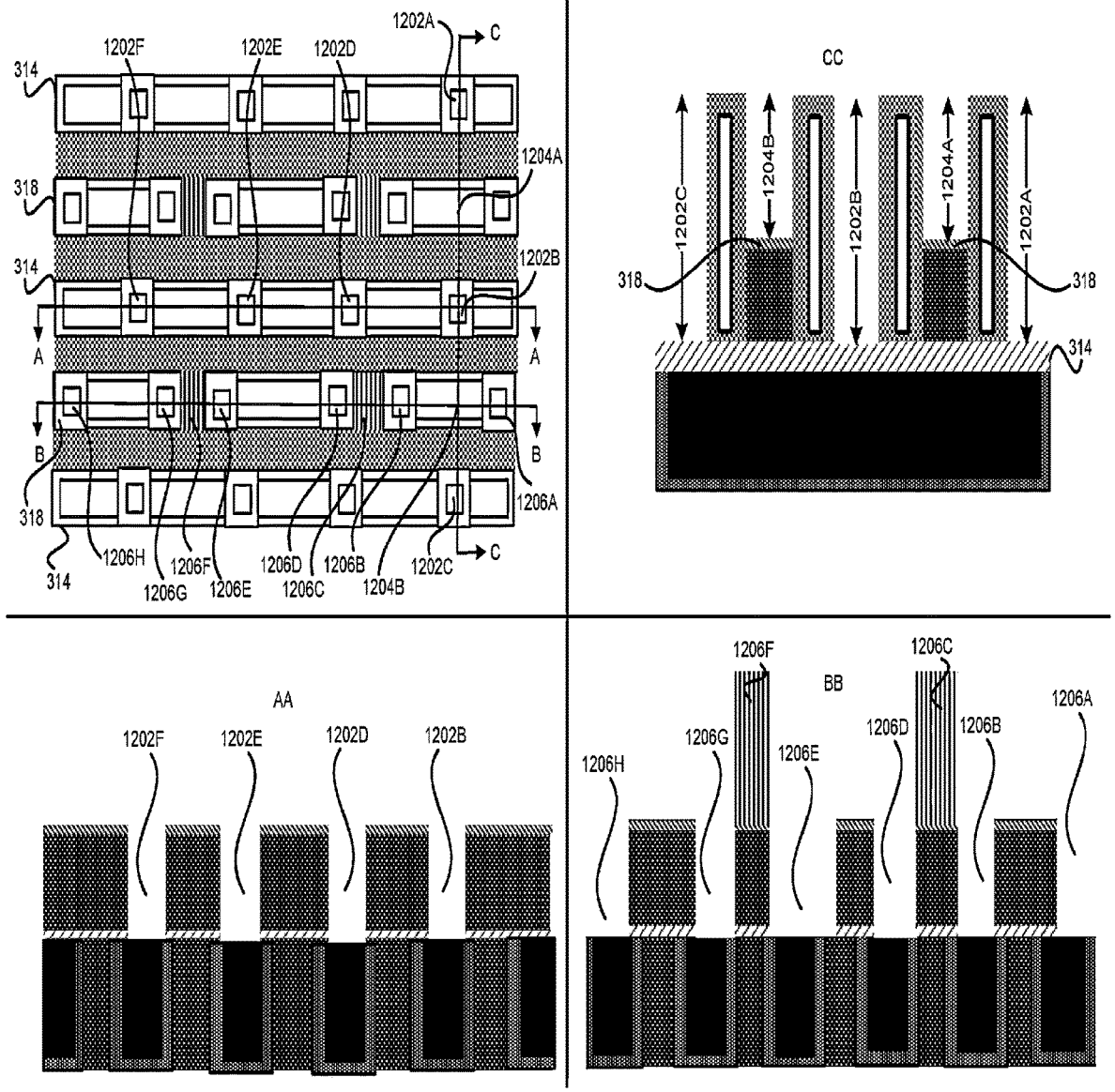
FIG. 12 depicts a block diagram of another portion of an example process for fabricating example self-aligned inline and line-end vias with air-gaps in accordance with an illustrative embodiment.

With reference to FIG. 12, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

All removable material located in the non-mandrel line locations 302A-C and mandrel line locations 304A-B is removed, e.g., by using RIE. In one embodiment, the removal is performed up to a HM layer. For example, as view CC shows, the removal reaches HIM layer 314 in non-mandrel line locations 302A-C, forming trenches 1202A, 1202B, and 1202C, respectively; and the removal reaches HM layer 318 in mandrel line locations 304A-B, forming trenches 1204A and 1204B, respectively.

TOP view show and view AA show the removal at the via locations in the non-mandrel layers. Particularly, the removal also removes HM 314 at the inline via locations 1202B, 1202D, 1202E, and 1202F.

TOP view show and view BB show the removal at the via locations in the mandrel layers. Particularly, the removal removes HM 314 at the line-end via locations 1206A, 1206C, 1206D, 1206E, 1206G, and 1206H. The removal leaves the dielectric material at locations 1206C and 1206F undisturbed.

Figure 13:
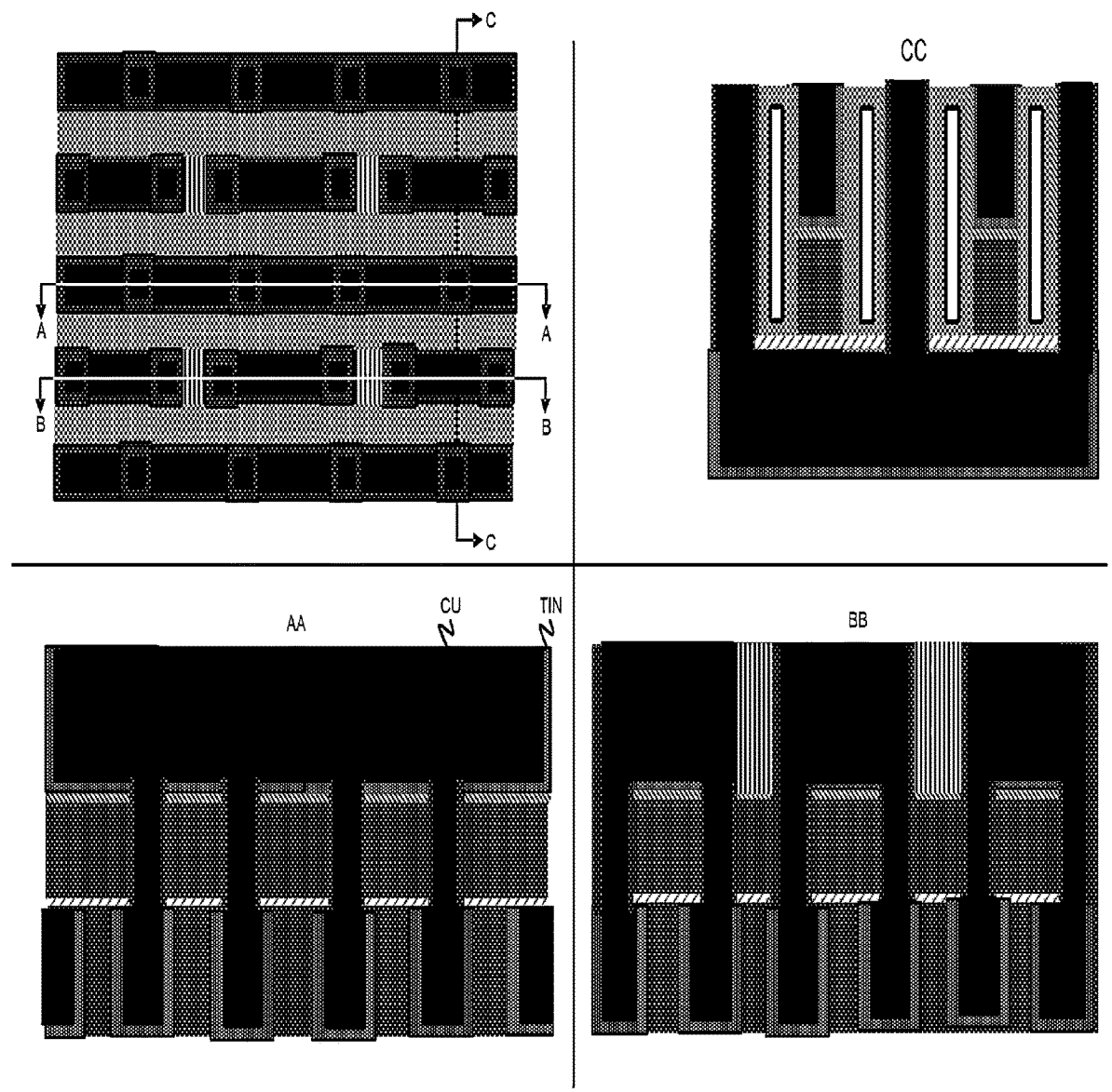
FIG. 13 depicts a block diagram of another portion of an example process for fabricating example self-aligned inline and line-end vias with air-gaps in accordance with an illustrative embodiment.

With reference to FIG. 13, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

All trenches formed in FIG. 12 are filled with a suitable metal to form self-aligned inline vias and line-end vias together with self-aligned air-gaps. In one embodiment, a suitable metal liner, such as Titanium Nitride (TiN), is deposited in the trenches before a suitable metal, such as Copper (Cu), is filled in the trenches. This figure depicts trenches 1202A-F, 1204A-B, 1206A-B, 1206D-E, and 1206G-H lines with a liner and filled with a metal in this manner.

Figure 14:
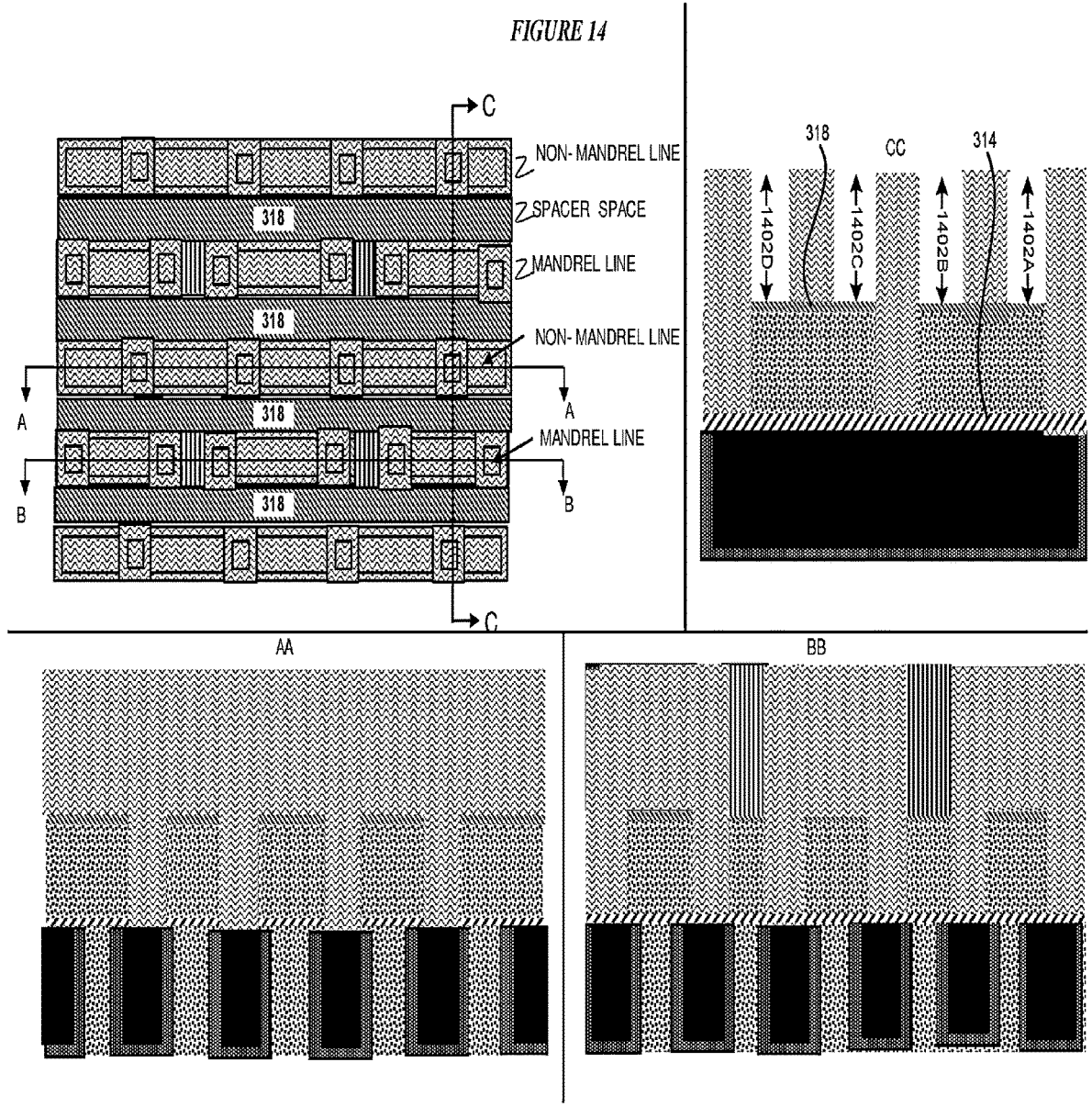
FIG. 14 depicts a block diagram of another portion of an example process for fabricating example self-aligned inline and line-end vias with air-gaps in accordance with an illustrative embodiment.

With reference to FIG. 14, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

In another embodiment, in a manner similar to the operation described in FIG. 10, all material located in the spacer locations 306A-D is removed, e.g., by using RIE. However, in this embodiment, the removal from the spacer locations is performed only up to middle HIM layer 318. The removal creates trenches 1402A, 1402B, 1402C, and 1402D in spacer locations 306A, 306B, 306C, and 306D, respectively, as shown in TOP view and view CC. views AA and BB do not show the effect of this removal due to their relative cut locations with respect to the spacer locations.

Figure 15:
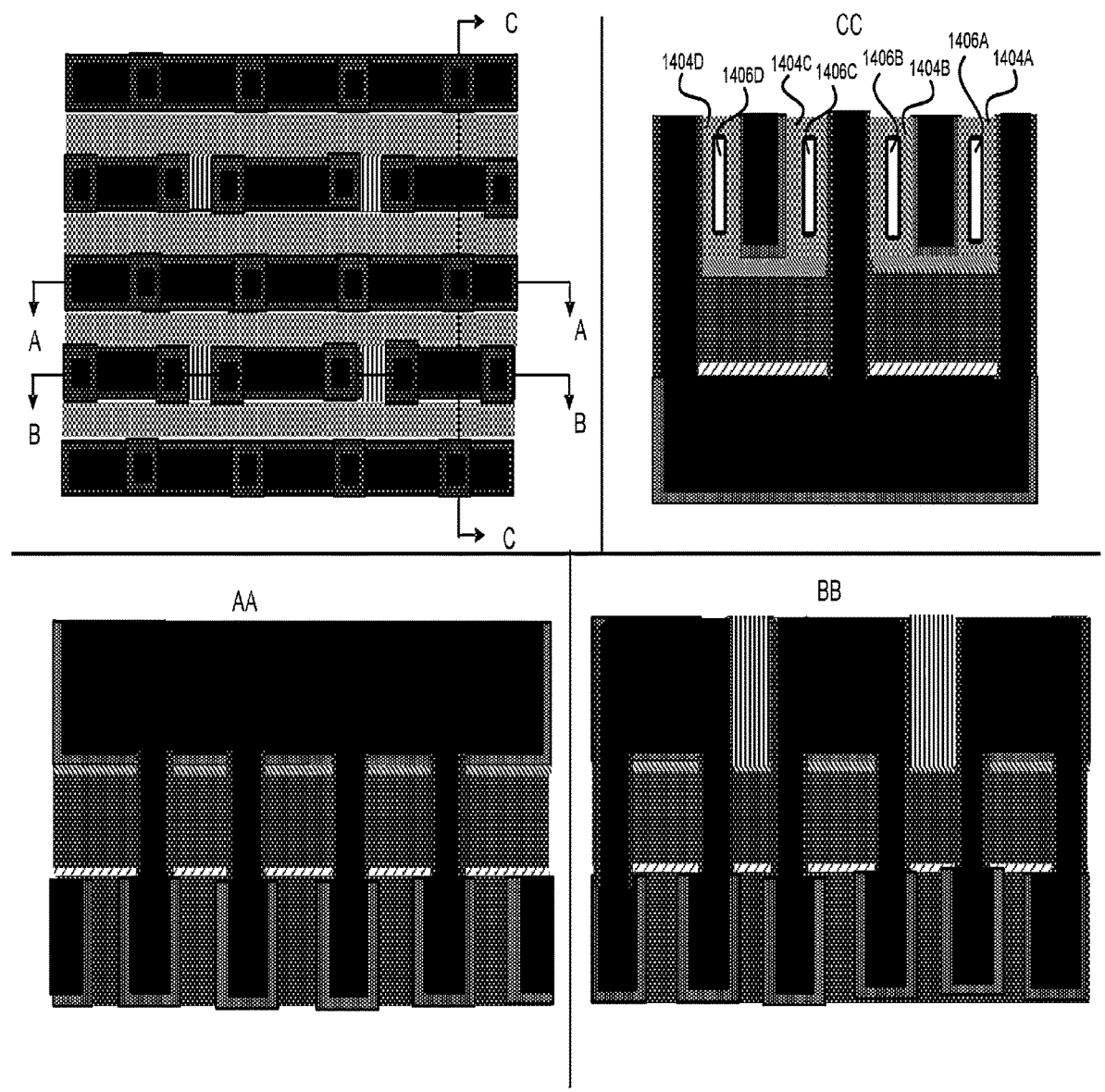
FIG. 15 depicts a block diagram of another portion of an example process for fabricating example self-aligned inline and line-end vias with air-gaps in accordance with an illustrative embodiment.

With reference to FIG. 15, this figure depicts a block diagram of another portion of an example process for fabricating example self-aligned inline and line-end vias with air-gaps in accordance with an illustrative embodiment. Application 105 in FIG. 1 interacts with fabrication system 107 to further manipulate structure 300 as described herein.

Further in the embodiment of FIG. 14, in the manner of the etching and air-gap creation operation of FIG. 12, airgaps are created in trenches 1402A-D by filling a low-K material 1404A, 1404B, 1404C, and 1404D, and forming air-gaps 1406A, 1406B, 1046C, 1406D, in trenches 1402A-D, respectively, as shown.

Further in this embodiment, trenches are formed in the manner of FIG. 13, all trenches formed by the etching similar to the etching of FIG. 12 are filled with a suitable metal to form self-aligned inline vias and line-end vias together with self-aligned air-gaps. In one embodiment, a suitable metal liner 1410, such as TiN, is deposited in the trenches before a suitable metal 1408, such as Cu, is filled in the trenches.

Figure 16:
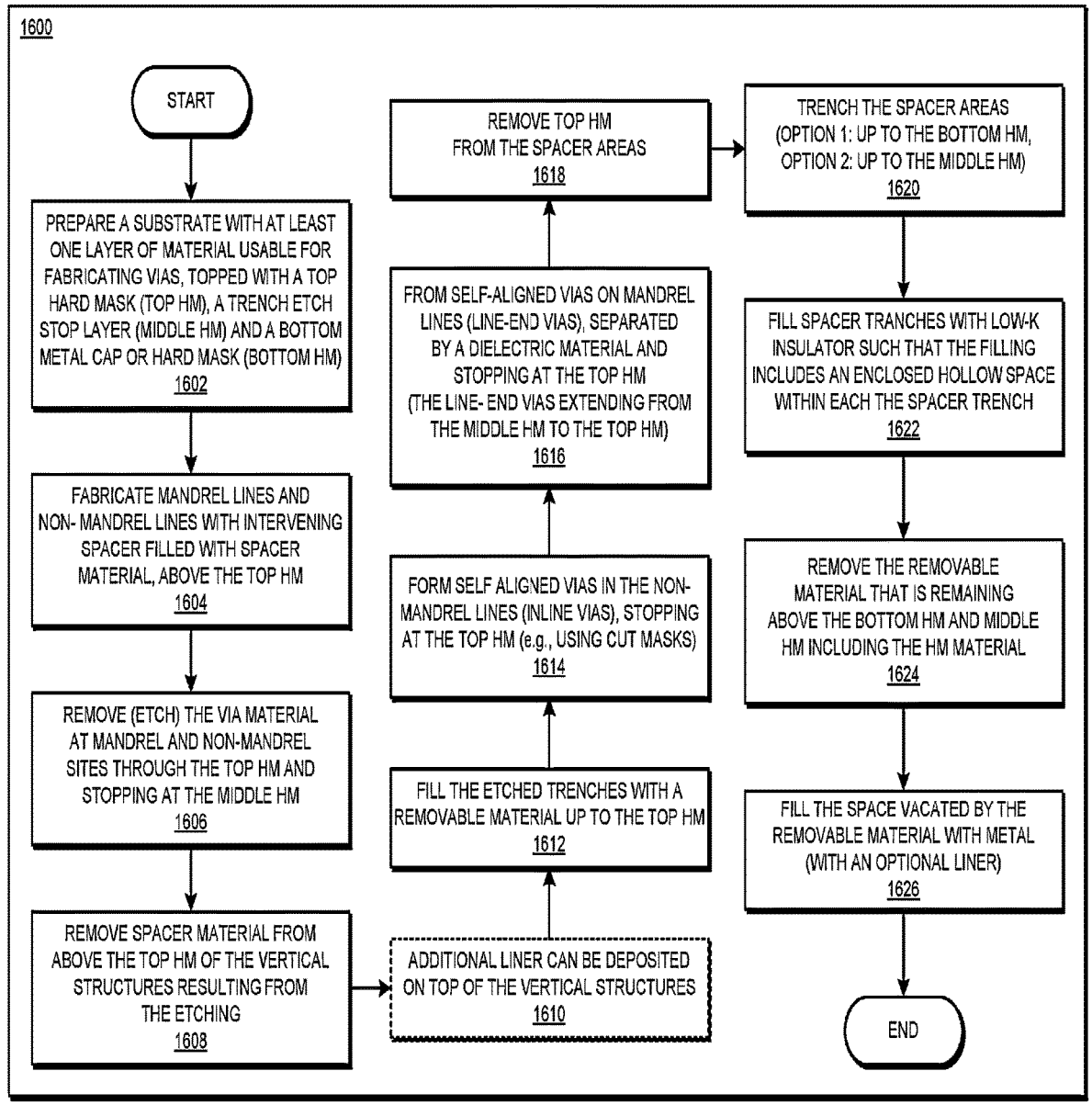
FIG. 16 depicts a flowchart of an example process for forming self-aligned vias and air-gaps in semiconductor fabrication in accordance with an illustrative embodiment.

With reference to FIG. 16, this figure depicts a flowchart of an example process for forming self-aligned vias and air-gaps in semiconductor fabrication in accordance with an illustrative embodiment. Process 1600 can be implemented in application 105 in FIG. 1.

The application prepares a substrate with at least one layer of material suitable for fabricating vias, the layer being topped with a hard mask layer, a trench etch stop layer (middle HM), and a bottom metal cap or hard mask (bottom HM) (block 1602). The application fabricates or locates mandrel lines and non-mandrel lines with intervening spacers, where the spacers are filled with spacer material above the top HM (block 1604).

The application removes or etches the via material at mandrel and non-mandrel line sites, etching through the top HM and stopping at the middle HM, the etching forming vertical structures and trenches (block 1606). The application removes the spacer material from above the top HM of the vertical spacer structures that result from the etching of block 1606 (block 1608). Optionally, the application deposits additional liner material on top of the vertical structures (block 1610).

The application fills the etched trenches from block 1606 with removable material up to the top HM (block 1612). The application forms self-aligned vias in the non-mandrel lines (inline vias), starting at the bottom BM and stopping at the top HM (block 1614). The application forms self-aligned vias in the mandrel lines (line-end vias) separated by a dielectric material, the line-end vias starting at the middle HM and stopping at the top HM (block 1616).

The application removes the top HM from the spacer areas (block 1618). The application trenches the spacer areas up to a suitable HM layer (block 1620). In one case, the trenches extend up to but not through the bottom HM. In another case, the trenches extend to but not through the middle HM.

The application fills the spacer trenches with low-K insulator such that the filling includes an enclosed hollow space (air-gap) within each spacer trench (block 1622). The application removes the removable material that is remaining above the bottom HM and the middle HM layers, including the HM layer material thereunder (block 1624).

The application fills the space vacated by the removed removable material and the HM material with a suitable metal and optionally a suitable liner (block 1626). The application ends process 1600 thereafter.

Thus, a computer implemented method, system or apparatus, and computer program product are provided in the illustrative embodiments for forming self-aligned vias and air-gaps in semiconductor fabrication and other related features, functions, or operations. Where an embodiment or a portion thereof is described with respect to a type of mobile device, the computer implemented method, system or apparatus, the computer program product, or a portion thereof, are adapted or configured for use with a suitable and comparable manifestation of that type of mobile device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A semiconductor device comprising:
a first line extending in a first direction;
a second line extending in the first direction, wherein the second line is in-line with the first line;
a first dielectric structure between the first line and the second line, wherein:
the first dielectric structure is in-line with the first line and the second line; and
the first dielectric structure comprises a first side and a second side opposite the first side;
a first end of the first line, wherein the first end of the first line directly contacts the first side of the first dielectric structure;
a first end of the second line, wherein the first end of the second line directly contacts the second side of the first dielectric structure;
a first via disposed at the first end of the first line, wherein an upper portion of the first via is self-aligned with the first dielectric structure; and
a second via disposed at the first end of the second line, wherein an upper portion of the second via is self-aligned with the first dielectric structure.

2. The semiconductor device of claim 1, wherein:
the upper portion of the first via is self-aligned with the first end of the first line; and
the upper portion of the second via is self-aligned with the first end of the second line.

3. The semiconductor device of claim 2, wherein:
the upper portion of the first via is also self-aligned with first opposite sidewalls of the first line, the first opposite sidewalls of the first line extending in the first direction; and
the upper portion of the second via is also self-aligned with first opposite sidewalls of the second line, the first opposite sidewalls of the second line extending in the first direction.

4. The semiconductor device of claim 1, wherein a width of the first line in a second direction orthogonal to the first direction, a width of the second line in the second direction, and a width of the first dielectric structure in the second direction are all substantially the same.

5. The semiconductor device of claim 4, wherein a height of the first line in a third direction, a height of the second line in the third direction, and a height of the first dielectric structure in the third direction are all substantially the same, wherein the third direction is orthogonal to the first and second directions.

6. The semiconductor device of claim 1, wherein a height of the first line in a third direction, a height of the second line in the third direction, and a height of the first dielectric structure in the third direction are all substantially the same, and wherein the third direction is orthogonal to the first direction.

7. The semiconductor device of claim 1, further comprising a second dielectric structure disposed under the first dielectric structure and next to the first via, wherein the first and second dielectric structures comprise different materials.

8. A semiconductor device comprising:
a first line extending in a first direction;
a second line extending in the first direction, wherein the second line is in-line with the first line;
a third line extending in the first direction, wherein the third line is parallel to the first line and the second line;
a first dielectric structure between the first line and the second line, wherein the first dielectric structure is in-line with the first line and the second line; and
a continuous air-gap extending in the first direction and formed in a second dielectric structure, wherein a first portion of the continuous air-gap is between the first line and the third line and a second portion of the continuous air-gap is between the second line and the third line.

9. The semiconductor device of claim 8, further comprising:
a first end of the first line, wherein the first end of the first line directly contacts the first dielectric structure and
a first end of the second line, wherein the first end of the second line directly contacts the first dielectric structure.

10. The semiconductor device of claim 9, further comprising:
a first via disposed at the first end of the first line, wherein an upper portion of the first via is self-aligned with the first dielectric structure; and
a second via disposed at the first end of the second line, wherein an upper portion of the second via is self-aligned with the first dielectric structure.

11. The semiconductor device of claim 10, wherein:
the upper portion of the first via is also self-aligned with first opposite sidewalls of the first line, the first opposite sidewalls of the first line extending in the first direction; and
the upper portion of the second via is also self-aligned with first opposite sidewalls of the second line, the first opposite sidewalls of the second line extending in the first direction.

12. The semiconductor device of claim 10, further comprising a second dielectric structure disposed under the first dielectric structure and next to the first via, wherein the first and second dielectric structures comprise different materials.

13. The semiconductor device of claim 8, wherein a height of the first line in a second direction, a height of the second line in the second direction, a height of the third line in the second direction, and a height of the first dielectric structure in the second direction are all substantially the same, and wherein the second direction is orthogonal to the first direction.

14. The semiconductor device of claim 9, further comprising:
a bottom surface of the first line disposed at a first vertical depth relative to a top surface of the first line;
a bottom surface of the first via disposed at a second vertical depth relative to the top surface of the first line;
a bottom surface of the continuous air-gap disposed at a third vertical depth relative to the top surface of the first line; and
wherein the third vertical depth is greater than the first vertical depth and less than the second vertical depth.

15. The semiconductor device of claim 14, wherein the third vertical depth is closer to the second vertical depth than the first vertical depth.

16. The semiconductor device of claim 10, further comprising a second dielectric structure disposed above, below, and along both sidewalls of the continuous air-gap.

17. The semiconductor device of claim 16, wherein the second dielectric structure is disposed directly on a hard mask layer.

18. The semiconductor device of claim 16, wherein the second dielectric structure comprises a low-k material.

19. The semiconductor device of claim 18, wherein the low-k material comprises carbon.

* * * * *